US009640543B2

(12) United States Patent
Choi

(10) Patent No.: US 9,640,543 B2
(45) Date of Patent: *May 2, 2017

(54) SEMICONDUCTOR DEVICE

(71) Applicant: SK hynix Inc., Gyeonggi-do (KR)

(72) Inventor: Eun-Seok Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/739,692

(22) Filed: Jun. 15, 2015

(65) Prior Publication Data

US 2016/0204119 A1 Jul. 14, 2016

(30) Foreign Application Priority Data

Jan. 13, 2015 (KR) .................... 10-2015-0005911

(51) Int. Cl.
| H01L 27/11521 | (2017.01) |
| H01L 27/11519 | (2017.01) |
| H01L 27/11551 | (2017.01) |
| H01L 27/112 | (2006.01) |
| H01L 27/11578 | (2017.01) |
| H01L 27/105 | (2006.01) |
| H01L 27/11524 | (2017.01) |

(Continued)

(52) U.S. Cl.
CPC ...... *H01L 27/11521* (2013.01); *H01L 27/105* (2013.01); *H01L 27/1128* (2013.01); *H01L 27/1157* (2013.01); *H01L 27/11519* (2013.01); *H01L 27/11524* (2013.01); *H01L 27/11551* (2013.01); *H01L 27/11565* (2013.01); *H01L 27/11578* (2013.01); *H01L 27/11582* (2013.01)

(58) Field of Classification Search
CPC .............. H01L 27/105; H01L 27/1052; H01L 27/1128; H01L 27/11521; H01L 27/11524; H01L 27/11531; H01L 27/11551; H01L 27/11578
See application file for complete search history.

(56) References Cited

U.S. PATENT DOCUMENTS 8,878,277 B2 * 11/2014 Lee ................... H01L 29/66833
257/314
2013/0009229 A1 * 1/2013 Lee ................... H01L 29/66833
257/314

(Continued)

FOREIGN PATENT DOCUMENTS

KR 1020130070922 6/2013

*Primary Examiner* — Eduardo A Rodela
(74) *Attorney, Agent, or Firm* — IP & T Group LLP

(57) ABSTRACT

A semiconductor device may include: a plurality of source-side half channels positioned in a first region and arranged in first to 2Nth rows, wherein N is an integer equal to or greater than 2; a plurality of first drain-side half channels positioned in a second region at one side of the first region and arranged in first to Nth rows; a plurality of second drain-side half channels positioned in a third region at the other side of the first region and arranged in first to Nth rows; a plurality of first pipe channels suitable for connecting the first to Nth rows of source-side half channels to the first to Nth rows of first drain-side half channels, respectively; and a plurality of second pipe channels suitable for connecting the (N+1)th to 2Nth rows of source-side half channels to the first to Nth rows of second drain-side half channels, respectively.

9 Claims, 13 Drawing Sheets

(51) Int. Cl.
*H01L 27/11565* (2017.01)
*H01L 27/1157* (2017.01)
*H01L 27/11582* (2017.01)

(56) References Cited

U.S. PATENT DOCUMENTS

2014/0374810 A1* 12/2014 Ahn ................... H01L 27/11551
257/314
2015/0084115 A1* 3/2015 Kim .................... H01L 27/0207
257/324

* cited by examiner

SEMICONDUCTOR DEVICE

CROSS-REFERENCE TO RELATED APPLICATIONS

The present application claims priority of Korean Patent Application No. 10-2015-0005911, filed on Jan. 13, 2015, which is incorporated herein by reference in its entirety.

BACKGROUND

1. Field

This patent document relates to a semiconductor device, and more particularly, to a three-dimensional (3D) nonvolatile memory device.

2. Description of the Related Art

A nonvolatile memory device maintains its stored data even without a constant source of power. Recently, the improvement in integration of two-dimensional (2D) memory devices, which are fabricated in a single layer over a silicon substrate, has reached its limit. Thus, a 3D nonvolatile memory device has been proposed, including memory cells which are vertically stacked over a silicon substrate.

FIG. 1 is a perspective view illustrating a conventional 3D nonvolatile memory device. To simplify the description, interlayer dielectric layers are not illustrated in FIG. 1.

Referring to FIG. 1, the 3D nonvolatile memory device includes a pipe channel PCH, a source-side half channel SCH, and a drain-side half channel DCH. The pipe channel PCH is buried in a pipe gate PG, and the source-side half channel SCH and the drain-side half channel DCH are connected to the pipe channel PCH. The source-side half channel SCH, the pipe channel PCH, and the drain-side half channel DCH form one full channel CH.

The memory device further includes source-side word lines S_WL and drain-side word lines D_WL. The source-side word lines S_WL are stacked while surrounding the source-side half channel SCH, and the drain-side word lines D_WL are stacked while surrounding the drain-side half channel DCH. The source-side word lines S_WL and the drain-side word lines D_WL are extended in parallel to a first direction I-I'. Furthermore, a source select line SSL is provided over the source-side word lines S_WL, and a drain select line DSL is provided over the drain-side word lines D_WL.

At this time, source-side channels SCH of strings ST0 and ST1 adjacent in a second direction II-II' are commonly connected to one source line SL, and drain-side channels DCH of the strings ST0 and ST1 are commonly connected to one bit line BL.

According to the above-described structure, however, word lines S_WL and D_WL that are narrow in width are stacked high. Thus, the stacked structure of the word lines may tilt. Furthermore, when a memory device is fabricated, stacked interlayer dielectric layers and conductive layers must be etched to form slits between a pair of source-side channel SCH and drain-side channel DCH forming one channel CH that is between the respective channels CH. Thus, the slits have a narrow width, and the difficulty level of the etching process increases. Furthermore, as the integration of the memory device increases, the number of word lines that need to be stacked further increases. Thus, the stacked structure of the word lines may tilt more, increasing the difficult of the etching process.

SUMMARY

Various embodiments are directed to a technology capable of reducing the numbers of slits and word lines in a 3D nonvolatile memory device, thereby improving stability, to avoiding tilting, and increasing integration.

In an embodiment, a semiconductor device may include: a plurality of source-side half channels positioned in a first region and arranged in first to 2Nth rows, wherein N is an integer equal to or greater than 2; a plurality of first drain-side half channels positioned in a second region at one side of the first region and arranged in first to Nth rows; a plurality of second drain-side half channels positioned in a third region at the other side of the first region and arranged in first to Nth rows; a plurality of first pipe channels suitable for connecting the first to Nth rows of source-side half channels to the first to Nth rows of first drain-side half channels, respectively; and a plurality of second pipe channels suitable for connecting the (N+1)th to 2Nth rows of source-side half channels to the first to Nth rows of second drain-side half channels, respectively.

Each of the source-side half channels may be offset from centers of the source-side half channels included in adjacent rows. Each of the first drain-side half channels may be offset from centers of the first drain-side half channels included in adjacent rows. Each of the second drain-side half channels may be offset from centers of the second drain-side half channels included in adjacent rows.

The first to Nth rows of source-side half channels, the first drain-side half channels, and the first pipe channels may form first to Nth memory strings, respectively, and the (N+1)th to 2Nth rows of source-side half channels, the second drain-side half channels, and the second pipe channels may form (N+1)th to 2Nth memory strings, respectively.

The plurality of source-side half channels may be controlled through a source select line, the plurality of first drain-side half channels may be controlled through a first drain select line, and the plurality of second drain-side half channels may be controlled through a second drain select line.

The plurality of source-side half channels may share a plurality of first word lines, and the first drain-side half channels and the second drain-side half channels may share a plurality of second word lines.

Each of the plurality of first pipe channels and the plurality of second pipe channels may be formed to have a different depth than adjacent pipe channels.

The plurality of first pipe channels and the plurality of second pipe channels may have the same length.

The plurality of first drain-side half channels and the first to Nth rows of source-side half channels may be formed at symmetric positions based on a boundary surface between the first and second regions, and the plurality of second drain-side half channels and the (N+1)th to 2Nth rows of source-side half channels may be formed at symmetrical positions based on a boundary surface between the first and third regions.

The plurality of first drain-side half channels and the first to Nth rows of source-side half channels, which are formed at the symmetric positions based on the boundary surface between the first and second regions, may be connected through the plurality of first pipe channels, respectively, and the plurality of second drain-side half channels and the (N+1)th to 2Nth rows of source-side half channels, which are formed at the symmetric positions based on the boundary surface between the first and third regions, may be connected through the plurality of second pipe channels, respectively.

Each of the plurality of first pipe channels and the plurality of second pipe channels may have a different depth than adjacent pipe channels.

Each of the plurality of first pipe channels and the plurality of second pipe channels may have a different length than adjacent pipe channels.

The semiconductor device may further comprise a plurality of bit lines each connected to a corresponding one of the first drain-side half channels and a corresponding one of the second drain-side half channels.

DETAILED DESCRIPTION

Figure 1:
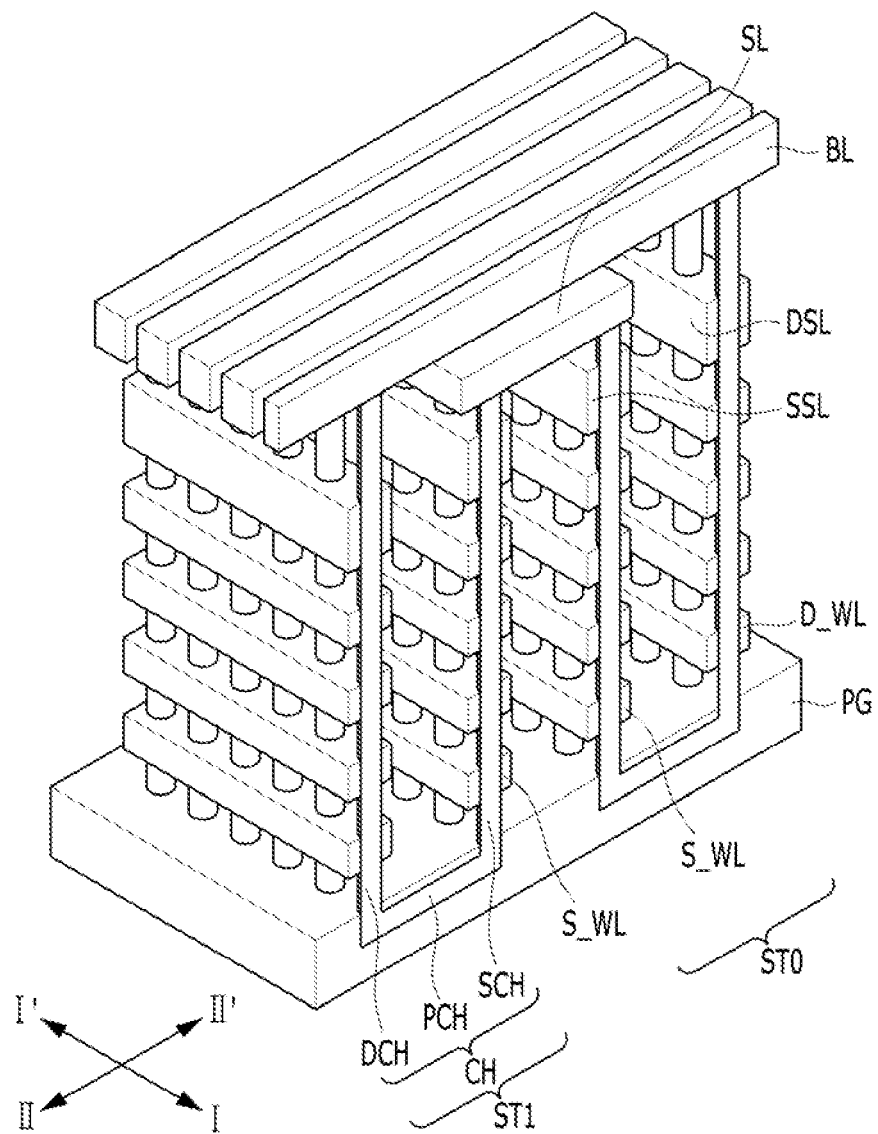
FIG. 1 is a perspective view illustrating a conventional 3D nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

FIGS. 2A to 2E are diagrams illustrating a structure of a nonvolatile memory device in accordance with an embodiment of the present invention.

Figure 2A:
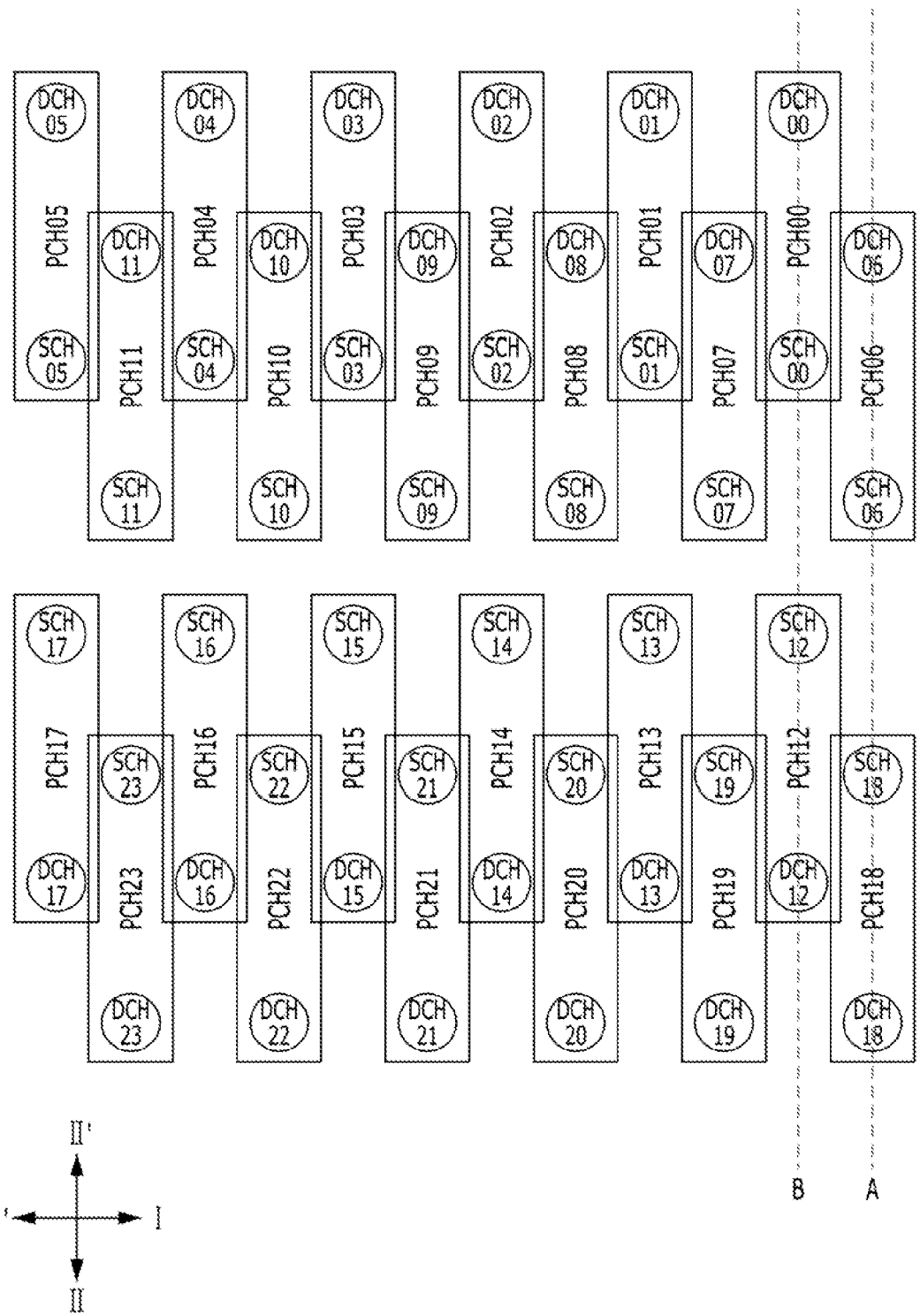
FIGS. 2A to 2E are layout diagrams and perspective views illustrating a nonvolatile memory device in accordance with an embodiment of the present invention.
Figure 2B:
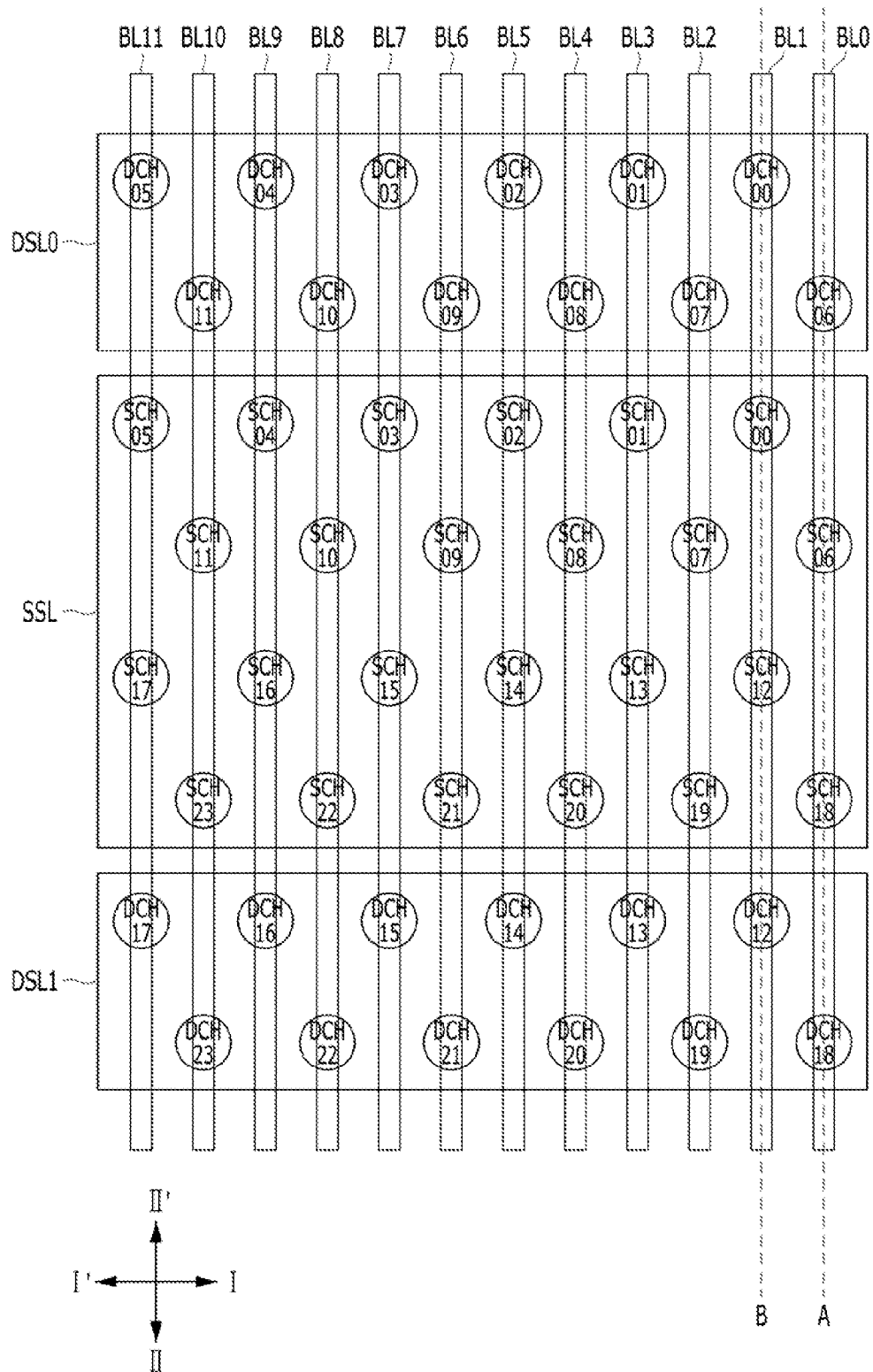
Figure 2C:
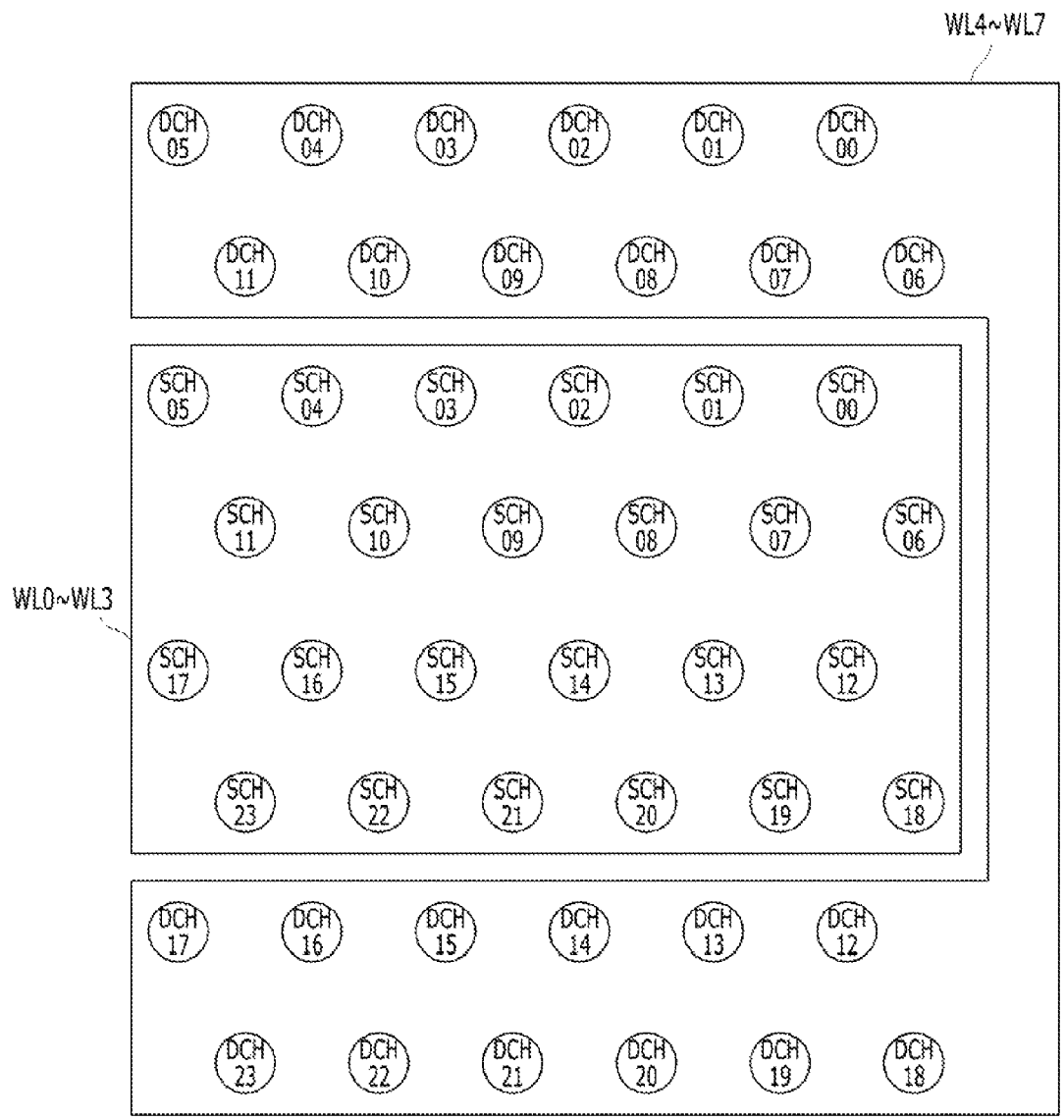

FIGS. 2A to 2C are layout diagrams illustrating the nonvolatile memory device in accordance with an embodiment of the present invention. FIGS. 2A to 2C illustrate first drain-side half channels DCH00 to DCH11, source-side half channels SCH00 to SCH23, and second drain-side half channels DCH12 to DCH23, which are arranged in first to eighth rows, respectively. FIG. 2A illustrates first pipe channels PCH00 to PCH11 and second pipe channels PCH12 to PCH23. FIG. 2B illustrates a source select line SSL, a first drain select line DSL0, a second drain select line DSL1, and bit lines BL0 to BL11. FIG. 2C illustrates first word lines WL0 to WL3 and second word lines WL4 to WL7.

Referring to FIG. 2A, the source-side half channels SCH00 to SCH23 may be arranged in four rows, i.e., the third to sixth rows. Each of the source-side half channels SCH00 to SCH23 may be offset from centers of the source-side half channels included in the adjacent rows. For example, the source-side half channels SCH00 to SCH05 included in the third row may be at different positions than the source-side half channels SCH06 to SCH11 included in the fourth row, based on the first direction I-I'. Similarly, the source-side half channels SCH12 to SCH17 included in the fifth row may be arranged at different positions than the source-side half channels SCH06 to SCH11 included in the fourth row adjacent to the fifth row and the source-side half channels SCH18 to SCH23 included in the sixth row adjacent to the fifth row, based on the first direction I-I'.

The first drain-side half channels DCH00 to DCH11 may be arranged in two rows, i.e., the first and second rows, at one side II' of a region where the source-side half channels SCH00 to SCH23 are positioned, based on the second direction II-II'. Each of the first drain-side half channels DCH00 to DCH11 may be offset from centers of the first drain-side half channels included in the adjacent row. For example, the first drain-side half channels DCH00 to DCH05 included in the first row may be arranged at different positions than the first drain-side half channels DCH06 to DCH11 included in the second row, based on the first direction I-I'.

The second drain-side half channels DCH12 to DCH23 may be arranged in two rows, i.e., the seventh and eighth rows, at the other side II of the region where the source-side half channels SCH00 to SCH23 are positioned, based on the second direction II-II'. Each of the second drain-side half channels DCH12 to DCH23 may be offset from centers of the second drain-side half channels included in the adjacent row. For example, the second drain-side half channels DCH12 to DCH17 included in the seventh row may be arranged at different positions than the second drain-side half channels DCH18 to DCH23 included in the eighth row, based on the first direction I-I'.

The first pipe channels PCH00 to PCH11 may connect the source-side half channels SCH00 to SCH11 in the third and fourth rows to the first drain-side half channels DCH00 to DCH11 in the first and second rows, respectively. Each of the first pipe channels PCH00 to PCH11 may have a different depth than adjacent pipe channels. For example, the first pipe channel PCH00 may have a depth shallower than the first pipe channels PCH06 and PCH07 adjacent to the first pipe channel PCH00. The first drain-side half channels DCH00 to DCH11 and the source-side half channels SCH00 to SCH11, which are connected through the first pipe channels PCH00 to PCH11, may form full channels, respectively. For example, the first drain-side half channel DCH03, the first pipe channel PCH03, and the source-side half channel SCH03 may form one full channel or a string.

The second pipe channels PCH12 to PCH23 may connect the source-side half channels SCH12 to SCH23 in the fifth and sixth rows to the second drain-side half channels DCH12 to DCH23 in the seventh and eighth rows, respectively. Each of the second pipe channels PCH12 to PCH23 may be formed to have a different depth than adjacent pipe channels. For example, the second pipe channel PCH12 may be shallower than the second pipe channels PCH18 and PCH19 adjacent to the second pipe channel PCH12. The second drain-side half channels DCH12 to DCH23 and the source-side half channels SCH12 to SCH23, which are connected through the second pipe channels PCH12 to PCH23, may form full channels, respectively. For example, the second drain-side half channel DCH20, the second pipe channel PCH200, and the source-side half channel SCH20 may form one full channel or a string.

Referring to FIG. 2B, the source-side half channels SCH00 to SCH23 may share the source select line SSL. The source select line SSL may be formed to surround the source-side half channels SCH00 to SCH23. The electrical coupling between the source-side half channels SCH00 to SCH23 and a source line SL may be controlled through the source select line SSL.

The first drain-side half channels DCH00 to DCH11 may share the first drain select line DSL0. The first drain select line DSL0 may to surround the first drain-side half channels DCH00 to DCH11. The electrical coupling between the first drain-side half channels DCH00 to DCH11 and the bit lines BL0 to BL11 may be controlled through the first drain select line DSL0.

The second drain-side half channels DCH12 to DCH23 may share the second drain select line DSL1. The second drain select line DSL1 may surround the second drain-side half channels DCH12 to DCH23. The electrical coupling between the second drain-side half channels DCH12 to DCH23 and the bit lines BL0 to BL11 may be controlled through the second drain select line DSL1.

The bit lines BL0 to BL11 may extend in the second direction II-II'. Each of the bit lines BL0 to BL11 may be connected to a corresponding one of the first drain-side half channels DCH00 to DCH11 and a corresponding one of the second drain-side half channels DCH12 to DCH23.

Referring to FIG. 2C, the source-side half channels SCH00 to SCH23 may share first word lines WL0 to WL3. The first word lines WL0 to WL3 may surround the source-side half channels SCH00 to SCH23. Since the first word lines WL0 to WL3 are formed in different layers while having the same shape, when viewed from the top, the first word lines WL0 to WL3 are illustrated as one word line in FIG. 2C.

The first drain-side half channels DCH00 to DCH11 and the second drain-side half channels DCH12 to DCH23 may share second word lines WL4 to WL7. The second word lines WL4 to WL7 may surround the first drain-side half channels DCH00 to DCH11 and the second drain-side half channels DCH12 to DCH23. Since the second word lines WL4 to WL7 are formed in different layers while having the same shape, when viewed from the top, the second word lines WL4 to WL7 are illustrated as one word line in FIG. 2C.

Figure 2D:
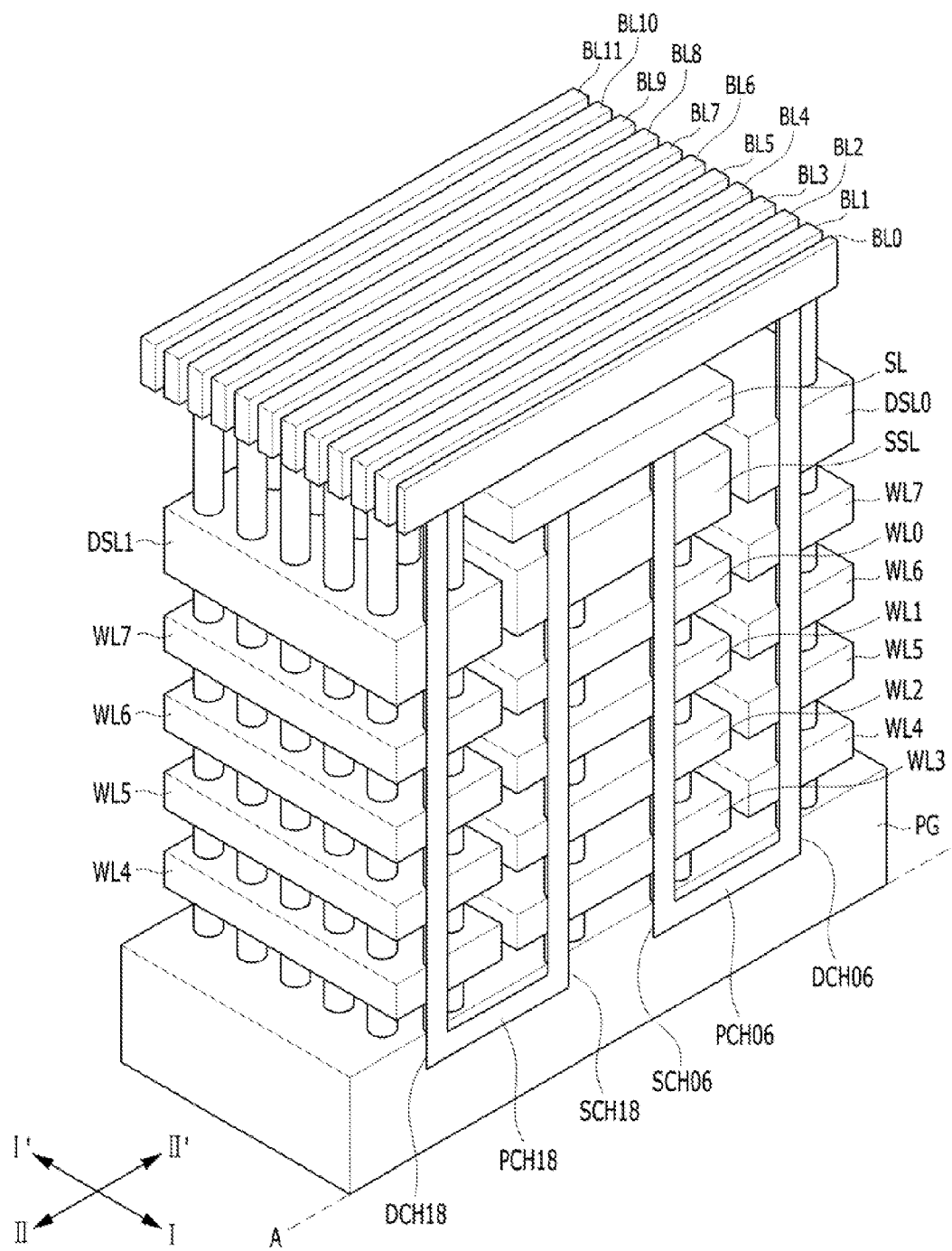
Figure 2E:
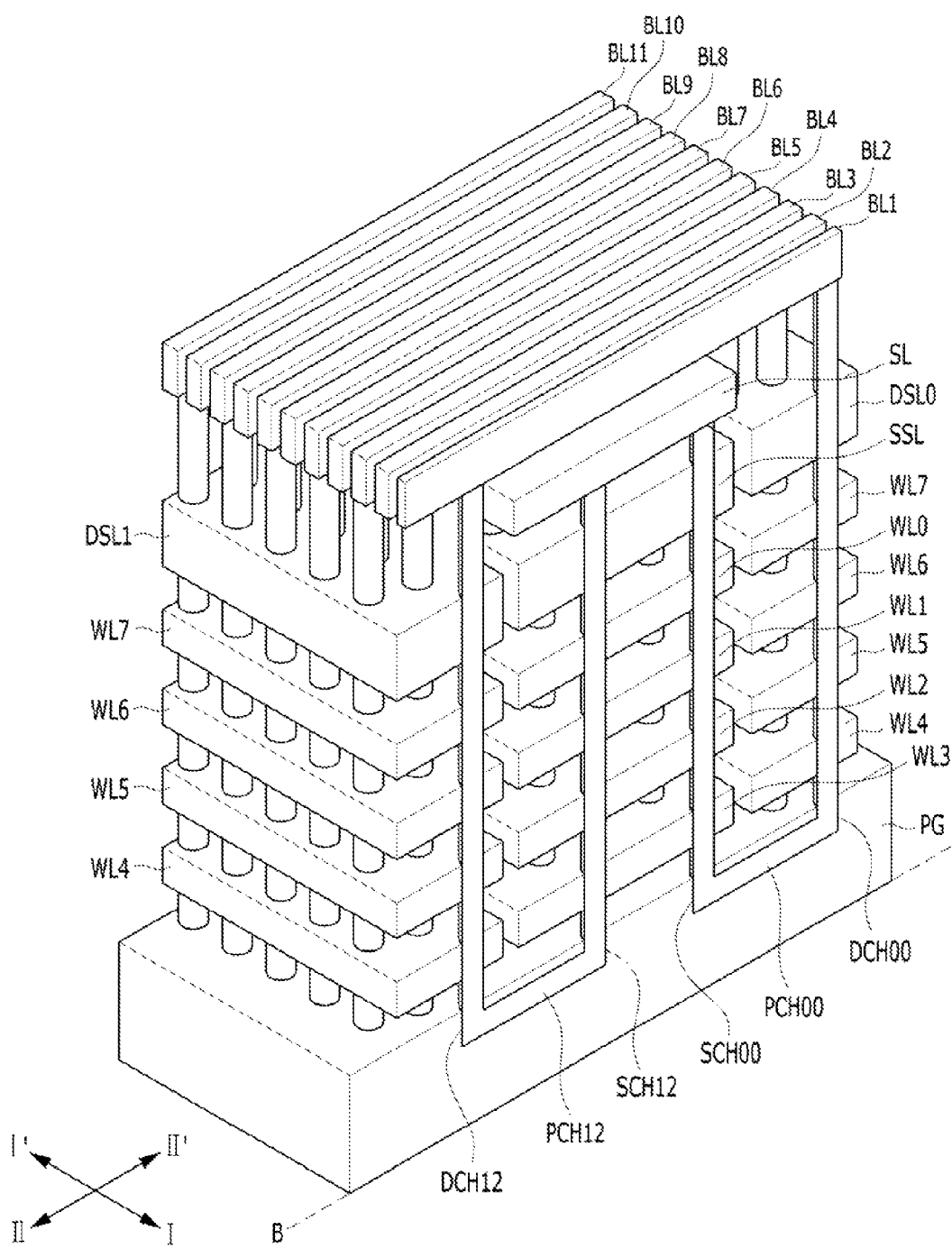

FIGS. 2D and 2E are perspective views illustrating the nonvolatile memory device in accordance with an embodiment of the present invention. FIG. 2D illustrates a cross-sectional view taken along line A in FIGS. 2A and 2B, and FIG. 2E illustrates a cross-sectional view taken along line B in FIGS. 2A and 2B.

Referring to FIGS. 2D and 2E, the first word lines WL0 to WL3, the second word lines WL4 to WL7, the bit lines BL0 to BL11, the source select line SSL, the first drain select line DSL0, the second drain select line DSL1, the source line SL, and the pipe gate PG are illustrated.

FIG. 2D illustrates that the first pipe channel PCH06 and the second pipe channel PCH18 are formed deep within the pipe gate PG. Furthermore, FIG. 2E illustrates that the first pipe channel PCH00 and the second pipe channel PCH12 are formed to have a shallow depth within the pipe gate PG.

In the nonvolatile memory device illustrated in FIGS. 2A to 2E, since the first word lines WL0 to WL3 and the source select line SSL are shared by the source-side half channels SCH00 to SCH23, the lines WL0 to WL3 and SSL may have a large width. Furthermore, since the second word lines WL4 to WL7 and the first drain select line DSL0 are shared by the first drain-side half channels DCH00 to DCH11, the lines WL4 to WL7 and DSL0 may have a large width. Furthermore, since the second word lines WL4 to WL7 and the second drain select line DSL1 are shared by the second drain-side half channels DCH12 to DCH23, the lines WL4 to WL7 and DSL1 may have a large width. Thus, since the lines WL0 to WL3, WL4 to WL7, SSL, DSL0, and DSL1 may be formed with a large width, it is possible to prevent tilting of the stacked patterns. Furthermore, since the lines WL0 to WL3, WL4 to WL7, SSL, DSL0, and DSL1 have a large width while being shared by more channels, the integration of the memory device may be further increased.

Figure 3:
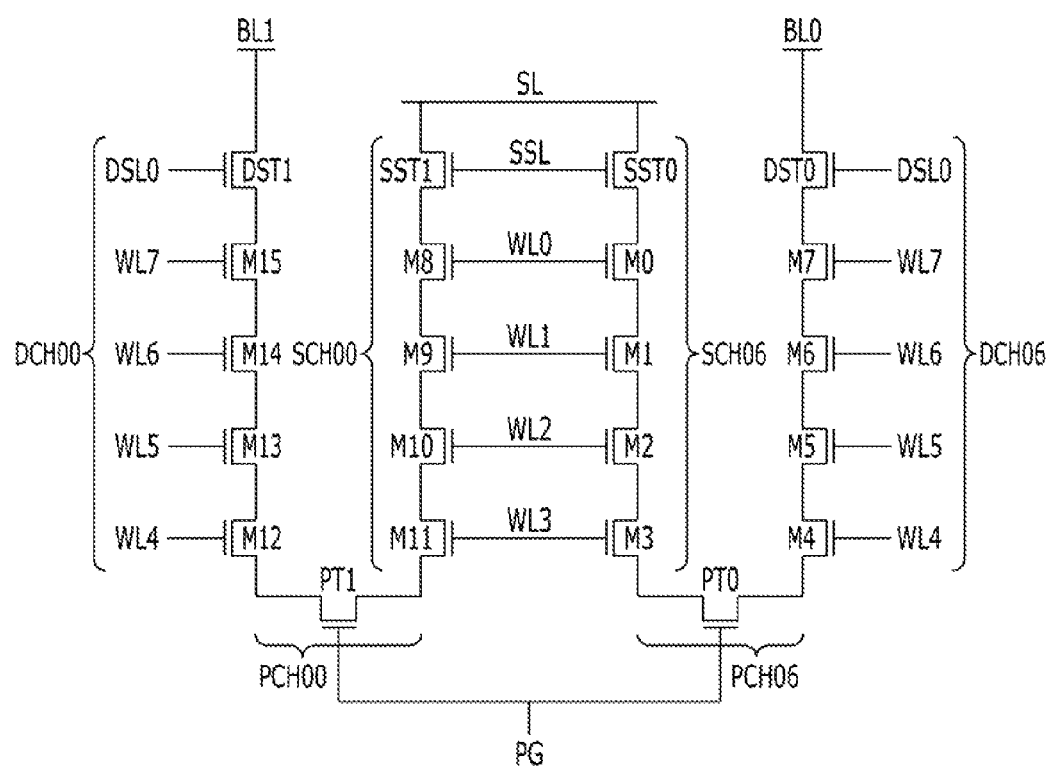
FIG. 3 is a circuit diagram illustrating the nonvolatile memory device illustrated in FIGS. 2A to 2E.

FIG. 3 is a circuit diagram illustrating the nonvolatile memory device illustrated in FIGS. 2A to 2E. FIG. 3 illustrates two strings. One string includes the source-side half-channel SCH06, the first pipe channel PCH06, and the first drain-side half channel DCH6, and the other string includes the source-side half channel SCH00, the first pipe channel PCH00, and the first drain-side half channel DCH00.

Referring to FIG. 3, the source-side half channel SCH06 may include memory cells MO to M3 and a source select transistor SST0. Each of the memory cells MO to M3 may be implemented with a transistor including a floating gate. The first pipe channel PCH06 may include a pipe transistor PT0. The first drain-side half channel DCH06 may include memory cells M4 to M7 and a drain select transistor DST0. Each of the memory cells M4 to M7 may be implemented with a transistor including a floating gate.

The source-side half channel SCH00 may include memory cells M8 to M11 and a source select transistor SST1. Each of the memory cells M8 to M11 may be implemented with a transistor including a floating gate. The first pipe channel PCH00 may include a pipe transistor PT1. The first drain-side half channel DCH00 may include memory cells M12 to M15 and a drain select transistor DST1. Each of the memory cells M12 to M15 may be implemented with a transistor including a floating gate.

In the above-described embodiment, the number of word lines WL0 to WL7 is set to 8, and the number of memory cells MO to M7 included in one string is set to 8. However, this is only an example, and the number of word lines and the number of memory cells included in one string may be set to 32, 64 or the like.

Figure 4A:
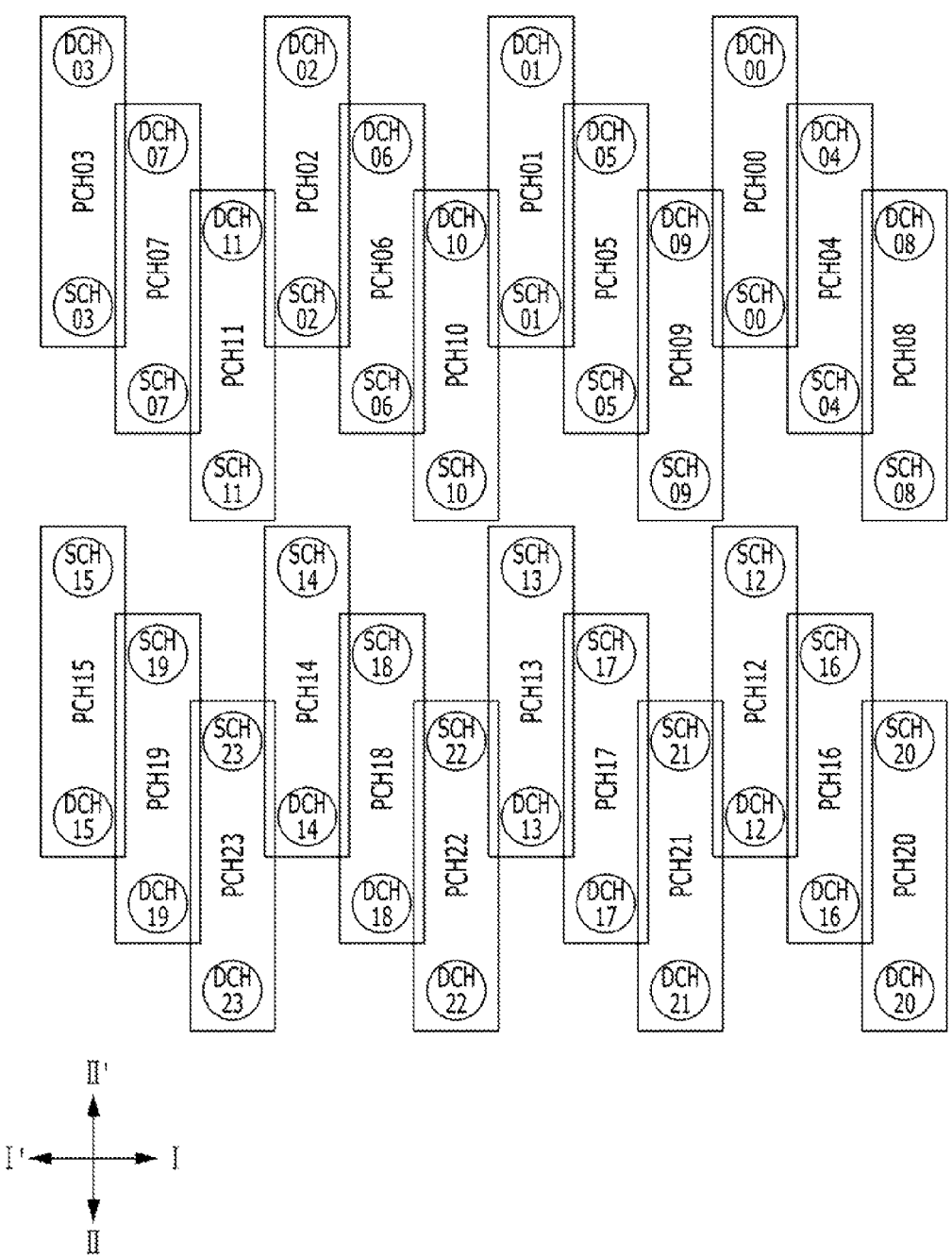
FIGS. 4A to 4C are layout diagrams illustrating a nonvolatile memory device in accordance with another embodiment of the present invention.
Figure 4B:
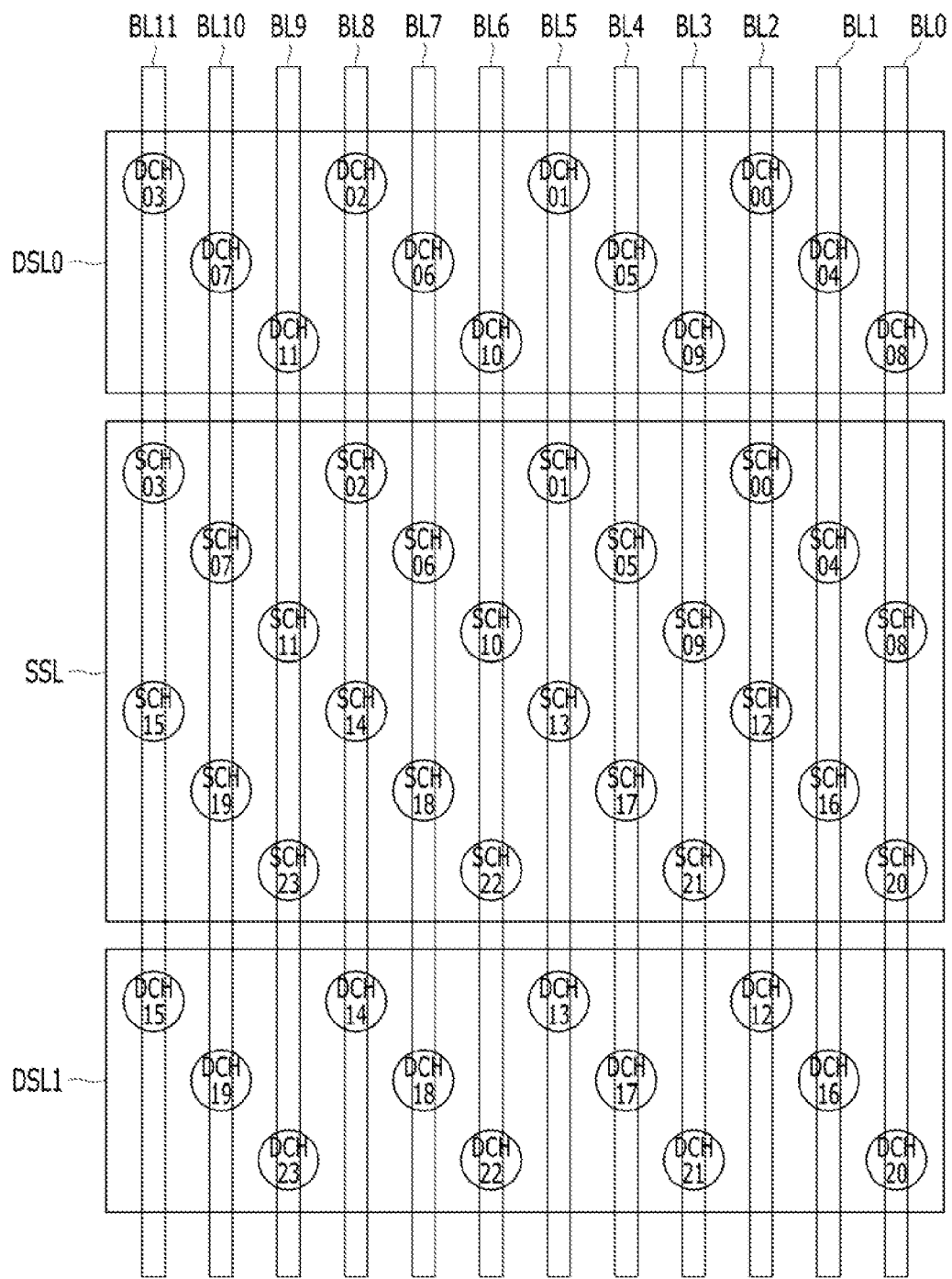
Figure 4C:
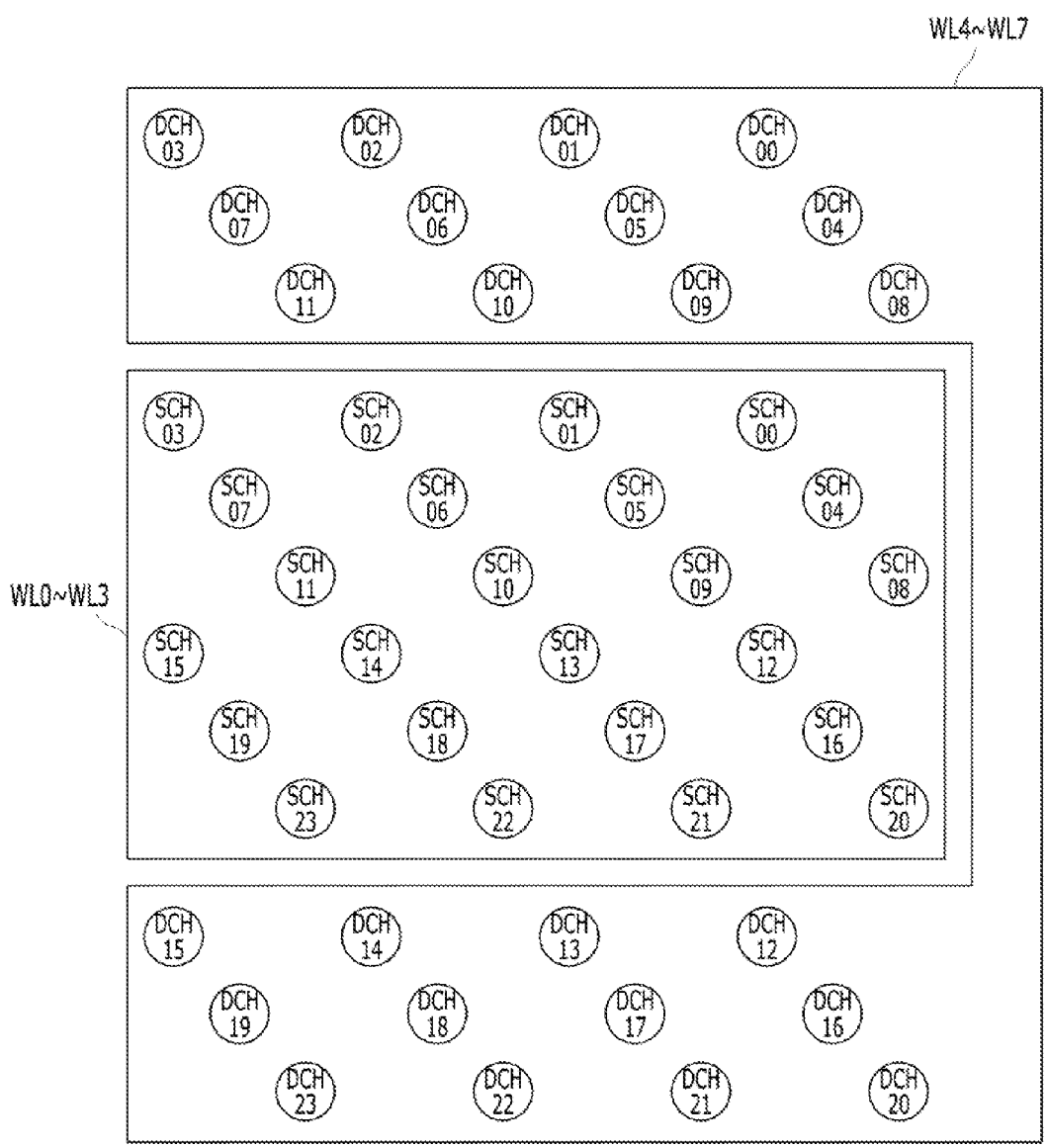

FIGS. 4A to 4C are layout diagrams illustrating a nonvolatile memory device in accordance with another embodiment of the present invention. In the present embodiment, source-side half channels SCH00 to SCH23 may be arranged in six rows, and first drain-side half channels DCH00 to DCH11 and second drain-side half channels DCH12 to DCH23 may be arranged in three rows, respectively.

FIGS. 4A to 4C illustrate the first drain-side half channels DCH00 to DCH11, the source-side half channels SCH00 to SCH23, and the second drain-side half channels DCH12 to DCH23, which are arranged in first to twelfth rows, respectively. FIG. 4A illustrates first pipe channels PCH00 to PCH11 and second pipe channels PCH12 to PCH23. FIG. 4B illustrates a source select line SSL, a first drain select line DSL0, a second drain select line DSL1, and bit lines BL0 to BL11. FIG. 4C illustrates first word lines WL0 to WL3 and second word lines WL4 to WL7.

Referring to FIG. 4A, the source-side half channels SCH00 to SCH23 may be arranged in the fourth to ninth rows. Each of the source-side half channels SCH00 to SCH23 may be offset from centers of the source-side half channels included in the adjacent rows. For example, the source-side half channels SCH00 to SCH03 included in the fourth row may be arranged at different positions than the source-side half channels SCH04 to SCH07 included in the fifth row adjacent to the fourth row, based on the first direction I-I'. Similarly, the source-side half channels SCH08 to SCH11 included in the sixth row may be arranged at different positions than the source-side half channels SCH04 to SCH07 included in the fifth row adjacent to the sixth row, based on the first direction I-I'.

The first drain-side half channels DCH00 to DCH11 may be arranged in the first to third rows at one side II' of the region where the source-side half channels SCH00 to SCH23 are positioned, based on the second direction II-II'. Each of the first drain-side half channels DCH00 to DCH11 may be offset from centers of the first drain-side half channels included in the adjacent rows. For example, the first drain-side half channels DCH00 to DCH03 included in the first row may be arranged at different positions than the first drain-side half channels DCH04 to DCH07 included in the second row adjacent to the first row, based on the first direction I-I'. Similarly, the first drain-side half channels DCH08 to DCH11 included in the third row may be arranged at different positions than the first drain-side half channels DCH04 to DCH07 included in the second row, based on the first direction I-I'.

The second drain-side half channels DCH12 to DCH23 may be arranged in tenth to twelfth rows at the other side II of the region where the source-side half channels SCH00 to SCH23 are positioned, based on the second direction II-II'. Each of the second drain-side half channels DCH12 to DCH23 may be offset from centers of the second drain-side half channels included in the adjacent rows. For example, the second drain-side half channels DCH12 to DCH15 included in the tenth row may be arranged at different positions than the second drain-side half channels DCH16 to DCH19 included in the eleventh row adjacent to the tenth row, based on the first direction I-I'. Similarly, the second drain-side half channels DCH200 to DCH23 included in the twelfth row may be arranged at different positions than the second drain-side half channels DCH16 to DCH19 included in the eleventh row adjacent to the twelfth row, based on the first direction I-I'.

The first pipe channels PCH00 to PCH11 may connect the source-side half channels SCH00 to SCH11 in the fourth to sixth rows to the first drain-side half channels DCH00 to DCH11 in the first to third rows, respectively. Each of the first pipe channels PCH00 to PCH11 may have a different depth than adjacent pipe channels. For example, the first pipe channel PCH04 may be shallower than the first pipe channels PCH00 and PCH08 adjacent to the first pipe channel PCH04. Furthermore, the first pipe channel PCH09 adjacent to the first pipe channel PCH00 may be shallower than the first pipe channel PCH00. The first drain-side half channels DCH00 to DCH11 and the source-side half channels SCH00 to SCH11, which are connected through the first pipe channels PCH00 to PCH11, may form full channels, respectively. For example, the first drain-side half channel DCH03, the first pipe channel PCH03, and the source-side half channel SCH03 may form one full channel or a string.

The second pipe channels PCH12 to PCH23 may connect the source-side half channels SCH12 to SCH23 in the seventh to ninth rows to the second drain-side half channels DCH12 to DCH23 in the tenth to twelfth rows. Each of the second pipe channels PCH12 to PCH23 may have a different depth than adjacent pipe channels. For example, the second pipe channel PCH16 may be shallower than the second pipe channels PCH12 and PCH200 adjacent to the second pipe channel PCH16. Furthermore, the second pipe channel PCH21 adjacent to the second pipe channel PCH12 may be shallower than the second pipe channel PCH12. The second drain-side half channels DCH12 to DCH23 and the source-side half channels SCH12 to SCH23, which are connected through the second pipe channels PCH12 to PCH23, may form full channels, respectively. For example, the second drain-side half channel DCH18, the second pipe channel PCH18, and the source-side half channel SCH18 may form one full channel or a string.

Referring to FIG. 4B, the source-side half channels SCH00 to SCH23 may share the source select line SSL. The source select line SSL may surround the source-side half channels SCH00 to SCH23. The electrical coupling between the source-side half channels SCH00 to SCH23 and the source line SL (not shown) may be controlled through the source select line SSL.

The first drain-side half channels DCH00 to DCH11 may share the first drain select line DSL0. The first drain select line DSL0 may surround the first drain-side half channels DCH00 to DCH11. The electrical coupling between the first drain-side half channels DCH00 to DCH11 and the bit lines BL0 to BL11 may be controlled through the first drain select line DSL0.

The second drain-side half channels DCH12 to DCH23 may share the second drain select line DSL1. The second drain select line DSL1 may surround the second drain-side half channels DCH12 to DCH23. The electrical coupling between the second drain-side half channels DCH12 to DCH23 and the bit lines BL0 to BL11 may be controlled through the second drain select line DSL1.

The bit lines BL0 to BL11 may be extended in the second direction II-II'. Each of the bit lines BL0 to BL11 may be connected to a corresponding one of the first drain-side half channels DCH00 to DCH11 and a corresponding one of the second drain-side half channels DCH12 to DCH23.

Referring to FIG. 4C, the source-side half channels SCH00 to SCH23 may share the first word lines WL0 to WL3. The first word lines WL0 to WL3 may surround the source-side half channels SCH00 to SCH23. Since the first word lines WL0 to WL3 are formed in different layers while having the same shape, when viewed from the top, the first word lines WL0 to WL3 are illustrated as one word line in FIG. 4C.

The first drain-side half channels DCH00 to DCH11 and the second drain-side half channels DCH12 to DCH23 may share the second word lines WL4 to WL7. The second word lines WL4 to WL7 may surround the first drain-side half channels DCH00 to DCH11 and the second drain-side half channels DCH12 to DCH23. Since the second word lines WL4 to WL7 are formed in different layers while having the same shape, when viewed from the top, the second word lines WL4 to WL7 are illustrated as one word line in FIG. 4C.

The nonvolatile memory device illustrated in FIGS. 4A to 4C has a different plan arrangement than the nonvolatile memory device illustrated in FIGS. 2A to 2E, but has substantially the same vertical structure as the nonvolatile memory device illustrated in FIGS. 2A to 2E. Thus, the perspective views of the nonvolatile memory device illustrated in FIGS. 4A to 4C are omitted herein.

The lines of the nonvolatile memory device illustrated in FIGS. 4A to 4C may be wider than the lines of the nonvolatile memory device illustrated in FIGS. 2A to 2E. Thus, the stability of the stacked patterns may be further improved, and the integration of the memory device may be further increased.

In the memory device illustrated in FIGS. 2A to 2E, the source-side half channels are arranged in four rows, and the first drain-side half channels and the second drain-side half channels are arranged in two rows, respectively. In the memory device illustrated in FIGS. 4A to 4C, the source-side half channels are arranged in six rows, and the first drain-side half channels and the second drain-side half channels are arranged in three rows, respectively. However, this is only an example. The source-side half channels may be arranged in 2N rows, and the first drain-side half channels and the second drain-side half channels may be arranged in N rows, where N is an integer equal to or greater than two.

Figure 5A:
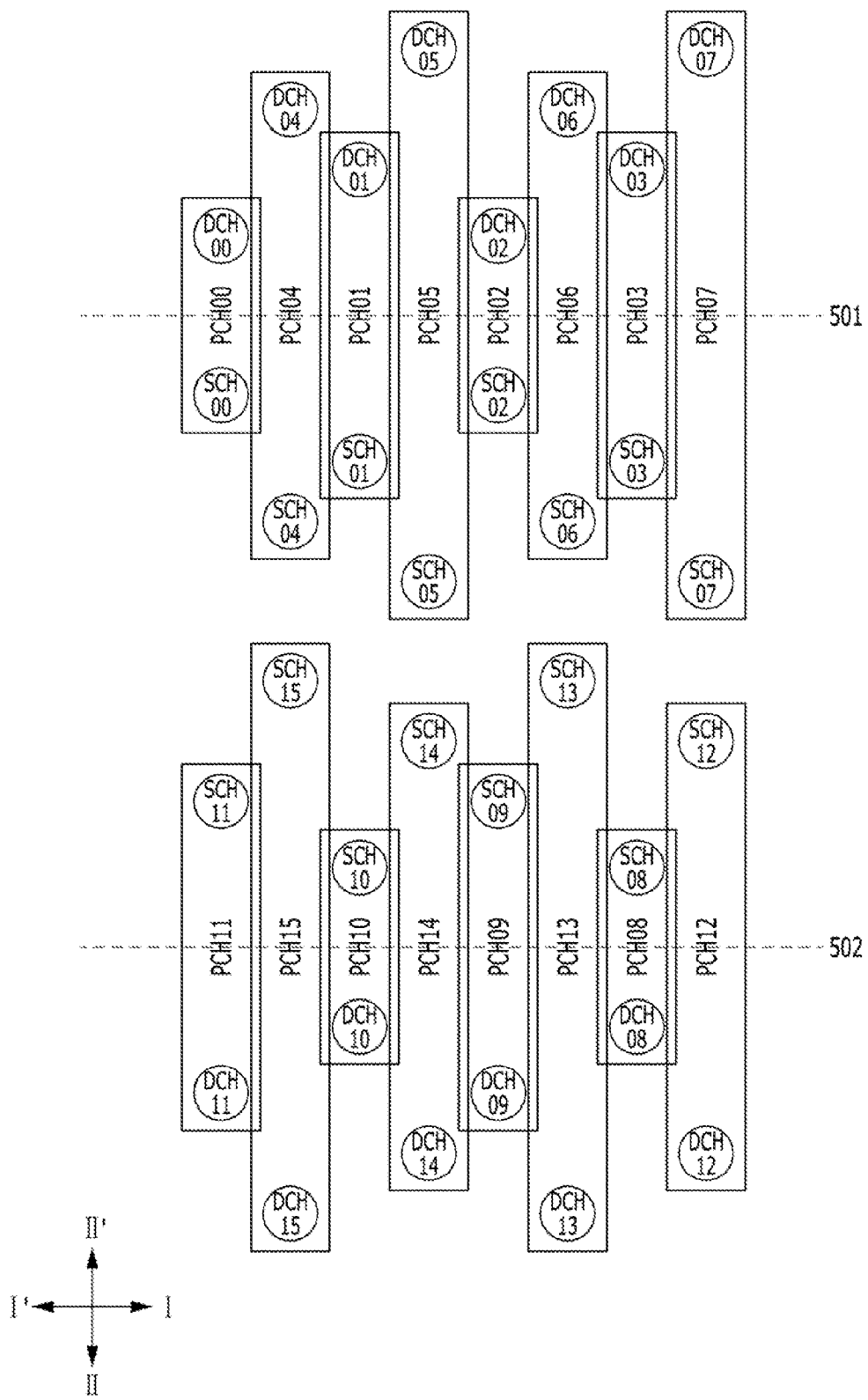
FIGS. 5A to 5C are layout diagrams illustrating a nonvolatile memory device in accordance with another embodiment of the present invention.
Figure 5B:
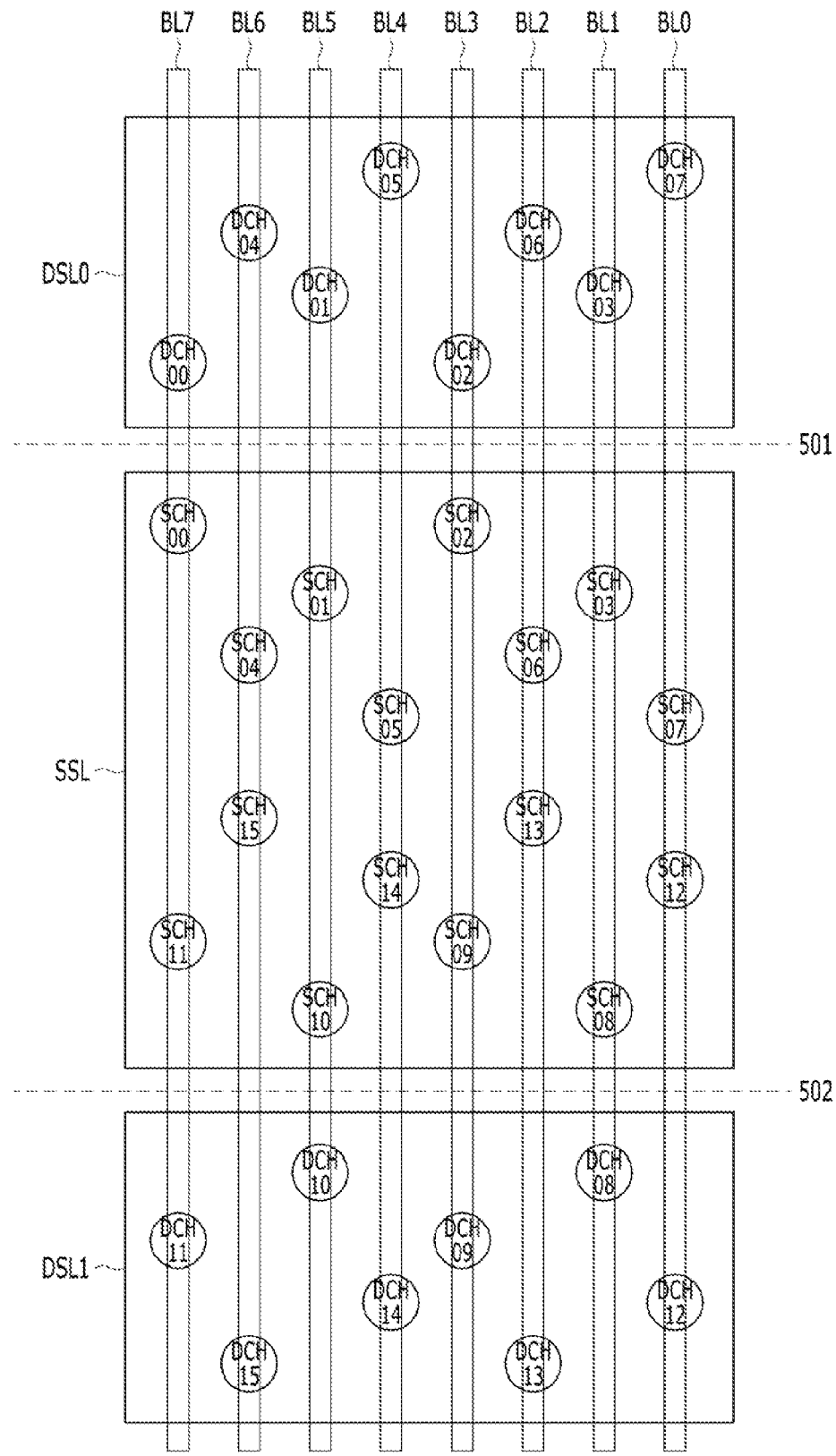
Figure 5C:
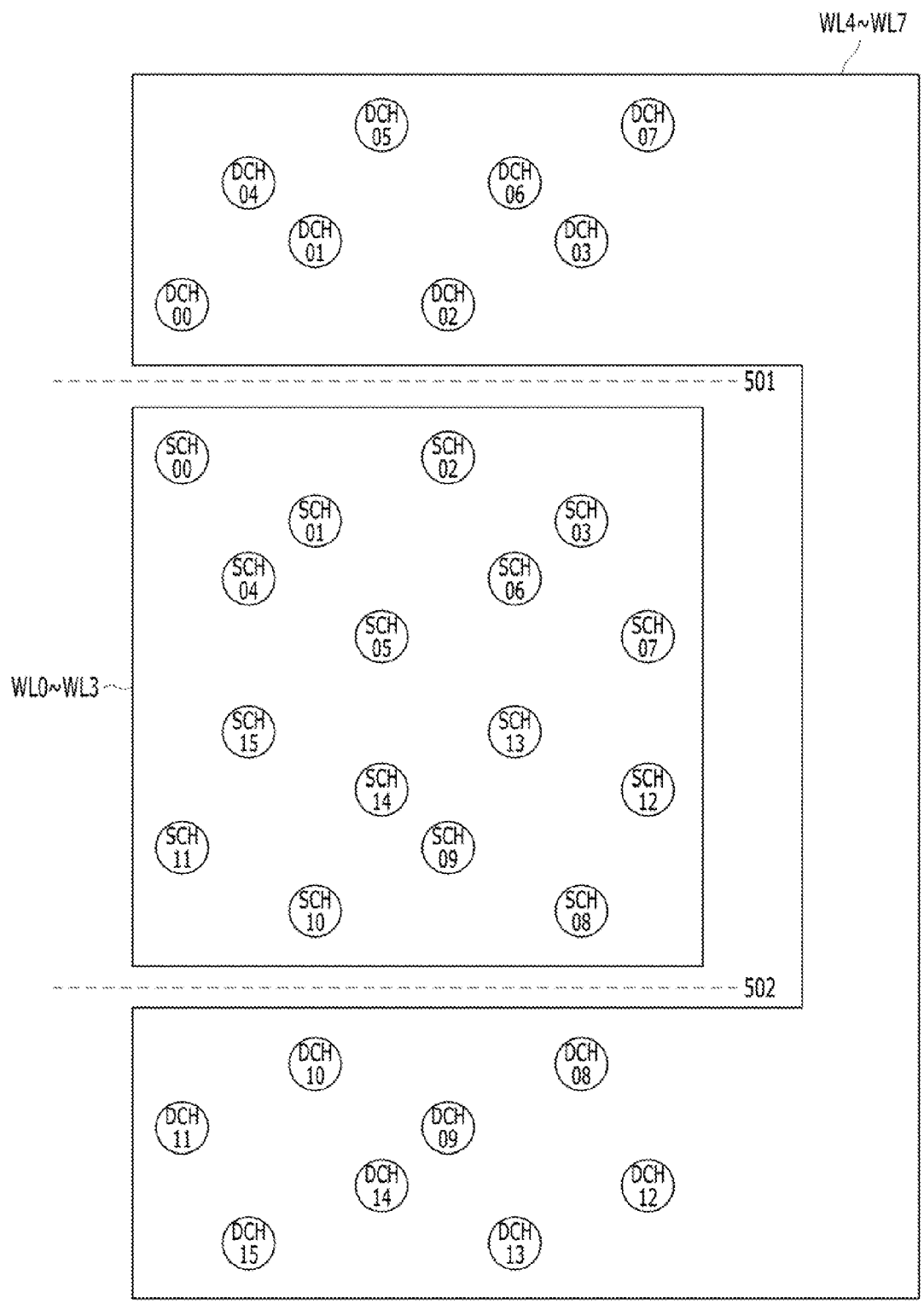

FIGS. 5A to 5C are layout diagrams illustrating a non-volatile memory device in accordance with another embodiment of the present invention.

FIGS. 5A to 5C illustrate first drain-side half channels DCH00 to DCH07, source-side half channels SCH00 to SCH15, and second drain-side half channels DCH08 to DCH15, which are arranged in first to sixteenth rows, respectively. FIG. 5A illustrates first pipe channels PCH00 to PCH07 and second pipe channels PCH08 to PCH15. FIG. 5B illustrates a source select line SSL, a first drain select line DSL0, a second drain select line DSL1, and bit lines BL0 to BL7. FIG. 5C illustrates first word lines WL0 to WL3 and second word lines WL4 to WL7.

Referring to FIG. 5A, the source-side half channels SCH00 to SCH15 may be arranged in eight rows, i.e., the fifth to twelfth rows. Each of the source-side half channels SCH00 to SCH23 may be offset from centers of the source-side half channels included in the adjacent rows. For example, the source-side half channels SCH00 and SCH02 included in the fifth row may be arranged at different positions than the source-side half channels SCH01 and SCH03 included in the sixth row, which is adjacent to the fifth row, based on the first direction I-I'.

The first drain-side half channels DCH00 to DCH7 may be arranged in four rows, i.e., the first to fourth rows, at one side II' of the region where the source-side half channels SCH00 to SCH15 are positioned, based on the second direction II-II'. Each of the first drain-side half channels DCH00 to DCH07 may be offset from centers of the first drain-side half channels included in the adjacent rows. For example, the first drain-side half channels DCH04 and DCH06 in the second row may be arranged at different positions than the first drain-side half channels DCH05 and DCH07 in the first row and the third drain-side half channels DCH01 and DCH03 in the third row, based on the first direction I-I'.

The first drain-side half channels DCH00 to DCH07 and the source-side half channels SCH00 to SCH07 in the fifth to eighth rows may be symmetrical, based on a boundary line 501 between a region in which the first drain-side half channels DCH00 to DCH07 are formed and a region in which the source-side half channels SCH00 to SCH15 are formed. That is, the first drain-side half channels DCH00 to DCH07 and the source-side half channels SCH00 to SCH07 in the fifth to eighth rows may be formed at the symmetrical positions based on the boundary line 501.

The second drain-side half channels DCH08 to DCH15 may be arranged in four rows, i.e., the thirteenth to sixteenth rows, at the other side II of the region where the source-side half channels SCH00 to SCH15 are positioned, based on the second direction II-II'. Each of the second drain-side half channels DCH08 to DCH15 may be offset from centers of the second drain-side half channels included in the adjacent rows. For example, the second drain-side half channels DCH11 and DCH09 in the fourteenth row may be arranged at different positions than the second drain-side half channels DCH10 and DCH08 in the thirteenth row and the second drain-side half channels DCH14 and DCH12 in the fifteenth row, based on the first direction I-I'.

The second drain-side half channels DCH08 to DCH15 and the source-side half channels SCH08 to SCH15 in the ninth to twelfth rows may be symmetrical, based on a boundary line 502 between a region in which the second drain-side half channels DCH08 to DCH15 are formed and the region in which the source-side half channels SCH00 to SCH15 are formed. That is, the second drain-side half channels DCH08 to DCH15 and the source-side half channels SCH08 to SCH15 of the ninth to twelfth rows may be symmetrical based on the boundary line 502.

The first pipe channels PCH00 to PCH07 may connect the source-side half channels SCH00 to SCH07 in the fifth to eighth rows to the first drain-side half channels DCH00 to DCH07 in the first to fourth rows, respectively. Each of the first pipe channels PCH00 to PCH07 may have a different depth than adjacent pipe channels. For example, the first pipe channels PCH00, PCH01, PCH02, and PCH03 may be shallower than the first pipe channels PCH04, PCH05, PCH06, and PCH07. The first drain-side half channels DCH00 to DCH07 and the source-side half channels SCH00 to SCH07, which are connected through the first pipe channels PCH00 to PCH07, may form full channels, respectively. For example, the first drain-side half channel DCH03, the first pipe channel PCH03, and the source-side half channel SCH03 may form one full channel or a string. Since the first drain-side half channels DCH00 to DCH07 and the source-side half channels SCH00 to SCH07 are symmetrical based on the boundary line 501, the first pipe channels PCH00 to PCH07 may have various lengths. For example, the first pipe channels PCH05 and PCH07 may be the longest, and the first pipe channels PCH00 and PCH02 may be the shortest.

The second pipe channels PCH08 to PCH15 may connect the source-side half channels SCH08 to SCH15 in the ninth to twelfth rows to the second drain-side half channels DCH08 to DCH15 in the thirteenth to sixteenth rows, respectively. Each of the second pipe channels PCH08 to PCH15 may have a different depth than adjacent pipe channels. For example, the second pipe channels PCH11, PCH10, PCH09, and PCH08 may be shallower than the second pipe channels PCH15, PCH14, PCH13, and PCH12. The second drain-side half channels DCH08 to DCH15 and the source-side half channels SCH08 to SCH15, which are connected through the second pipe channels PCH08 to PCH15, may form full channels, respectively. For example, the second drain-side half channel DCH10, the second pipe channel PCH10, and the source-side half channel SCH10 may form one full channel or a string. Since the second drain-side half channels DCH08 to DCH15 and the source-side half channels SCH08 to SCH15 are symmetrical based on the boundary line 502, the second pipe channels PCH08 to PCH15 may have various lengths. For example, the second pipe channels PCH15 and PCH13 may be the longest, and the first pipe channels PCH10 and PCH08 may be the shortest.

Referring to FIG. 5B, the source-side half channels SCH00 to SCH15 may share the source select line SSL. The source select line SSL may surround the source-side half channels SCH00 to SCH15. The electrical coupling between the source-side half channels SCH00 to SCH15 and a source line SL (not shown) may be controlled through the source select line SSL.

The first drain-side half channels DCH00 to DCH07 may share the first drain select line DSL0. The first drain select line DSL0 may surround the first drain-side half channels DCH00 to DCH07. The electrical coupling between the first drain-side half channels DCH00 to DCH07 and the bit lines BL0 to BL7 may be controlled through the first drain select line DSL0.

The second drain-side half channels DCH08 to DCH15 may share the second drain select line DSL1. The second drain select line DSL1 may surround the second drain-side half channels DCH08 to DCH15. The electrical coupling between the second drain-side half channels DCH08 to DCH15 and the bit lines BL0 to BL7 may be controlled through the second drain select line DSL1.

The bit lines BL0 to BL7 may be extended in the second direction II-II'. Each of the bit lines BL0 to BL07 may be connected to a corresponding one of the first drain-side half channels DCH00 to DCH07 and a corresponding one of the second drain-side half channels DCH08 to DCH15.

Referring to FIG. 5C, the source-side half channels SCH00 to SCH15 may share the first word lines WL0 to WL3. The first word lines WL0 to WL3 may surround the source-side half channels SCH00 to SCH15. Since the first word lines WL0 to WL3 are formed in different layers while having the same shape, when viewed from the top, the first word lines WL0 to WL3 are illustrated as one word line in FIG. 5C.

The first drain-side half channels DCH00 to DCH07 and the second drain-side half channels DCH08 to DCH15 may share the second word lines WL4 to WL7. The second word lines WL4 to WL7 may surround the first drain-side half channels DCH00 to DCH07 and the second drain-side half channels DCH08 to DCH15. Since the second word lines WL4 to WL7 are formed in different layers while having the same shape, when viewed from the top, the second word lines WL4 to WL7 are illustrated as one word line in FIG. 5C.

The nonvolatile memory device illustrated in FIGS. 5A to 5C has a different plan arrangement than the nonvolatile memory device illustrated in FIGS. 2A to 2E, but has substantially the same vertical structure as the nonvolatile memory device illustrated in FIGS. 2A to 2E. Thus, the perspective views of the nonvolatile memory device illustrated in FIGS. 5A to 5C are omitted herein.

In accordance with the embodiments of the present invention, the numbers of slits and word lines in the 3D nonvolatile memory device may be reduced to improve the integration and stability to avoiding tilting.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
    a plurality of source-side half channels positioned in a first region and arranged in first to 2Nth rows, wherein N is an integer equal to or greater than 2;
    a plurality of first drain-side half channels positioned in a second region at one side of the first region and arranged in first to Nth rows;
    a plurality of second drain-side half channels positioned in a third region at the other side of the first region and arranged in first to Nth rows;
    a plurality of first pipe channels suitable for connecting the first to Nth rows of source-side half channels to the first to Nth rows of first drain-side half channels, respectively; and
    a plurality of second pipe channels suitable for connecting (N+1)th to 2Nth rows of source-side half channels to the first to Nth rows of second drain-side half channels, respectively,
    wherein each of the second drain-side half channels is offset from centers of the second drain-side half channels in adjacent rows.

2. The semiconductor device of claim 1, wherein each of the source-side half channels is offset from centers of the source-side half channels in adjacent rows.

3. The semiconductor device of claim 1, wherein each of the first drain-side half channels is offset from centers of the first drain-side half channels in adjacent rows.

4. The semiconductor device of claim 1,
    wherein the first to Nth rows of source-side half channels, the first drain-side half channels, and the first pipe channels form first to Nth memory strings, respectively, and
    wherein the (N+1)th to 2Nth rows of source-side half channels, the second drain-side half channels, and the second pipe channels form (N+1)th to 2Nth memory strings, respectively.

5. The semiconductor device of claim 1,
    wherein the plurality of source-side half channels are controlled through a source select line,
    wherein the plurality of first drain-side half channels are controlled through a first drain select line, and
    wherein the plurality of second drain-side half channels are controlled through a second drain select line.

6. The semiconductor device of claim 1,
    wherein the plurality of source-side half channels share a plurality of first word lines, and
    wherein the first drain-side half channels and the second drain-side half channels share a plurality of second word lines.

7. The semiconductor device of claim 1, wherein each of the plurality of first pipe channels and the plurality of second pipe channels have a different depth than adjacent pipe channels.

8. The semiconductor device of claim 1, wherein the plurality of first pipe channels and the plurality of second pipe channels have the same length.

9. The semiconductor device of claim 1, further comprising:
    a plurality of bit lines each connected to a corresponding one of the first drain-side half channels and a corresponding one of the second drain-side half channels.

* * * * *